US012656416B2

(12) United States Patent
Wang et al.

(10) Patent No.: US 12,656,416 B2
(45) Date of Patent: Jun. 16, 2026

(54) HARMONIC SUPPRESSION CIRCUIT FOR TUNNELING MAGNETORESISTANCE SENSORS

(71) Applicant: Wenzhou University, Zhejiang (CN)

(72) Inventors: Pengjun Wang, Zhejiang (CN); Xiangyu Li, Zhejiang (CN); Bo Chen, Zhejiang (CN); Cai Long Jin, Zhejiang (CN)

(73) Assignee: Wenzhou University, Zhejiang (CN)

( * ) Notice: Subject to any disclaimer, the term of this patent is extended or adjusted under 35 U.S.C. 154(b) by 147 days.

(21) Appl. No.: 18/888,164

(22) Filed: Sep. 18, 2024

(65) Prior Publication Data

US 2025/0370071 A1 Dec. 4, 2025

(30) Foreign Application Priority Data

May 31, 2024 (CN) .......................... 202410692945.8

(51) Int. Cl.
G01R 33/00 (2006.01)
G01R 33/09 (2006.01)

(52) U.S. Cl.
CPC ..... *G01R 33/0041* (2013.01); *G01R 33/0029* (2013.01); *G01R 33/098* (2013.01)

(58) Field of Classification Search
None
See application file for complete search history.

(56) References Cited

U.S. PATENT DOCUMENTS

| | | | |
|---|---|---|---|
| 11,062,729 B2 * | 7/2021 | Aria ..................... | G11B 5/3909 |
| 12,411,188 B2 * | 9/2025 | Wang ................... | G01R 33/098 |
| 2010/0321105 A1 * | 12/2010 | Romero ............... | H03H 19/004 |
| | | | 327/554 |
| 2011/0221518 A1 * | 9/2011 | Romero ............... | H03H 19/004 |
| | | | 327/554 |

* cited by examiner

*Primary Examiner* — Rodney E Fuller
(74) *Attorney, Agent, or Firm* — JCIPRNET

(57) ABSTRACT

Disclosed is a harmonic suppression circuit for tunneling magnetoresistance sensors, which restrains even-order harmonic distortion by means of a fully differential interface circuit topological structure, restrains the charge injection and clock feedthrough effect of transistors by means of a virtual geminate transistor parallel structure and reduces the on resistance by means of a complementary switch structure to effectively restrain harmonic distortion. The harmonic suppression circuit for tunneling magnetoresistance sensors has a high linearity and has a high reading accuracy when used for reading sensing data of tunneling magnetoresistance sensors.

8 Claims, 4 Drawing Sheets

Tunneling magnetoresistance sensor

HARMONIC SUPPRESSION CIRCUIT FOR TUNNELING MAGNETORESISTANCE SENSORS

CROSS-REFERENCE TO RELATED APPLICATION

This application claims the priority benefit of China application serial no. 202410692945.8, filed on May 31, 2024. The entirety of the above-mentioned patent application is hereby incorporated by reference herein and made a part of this specification.

BACKGROUND

Technical Field

The invention relates to reading circuits, and particularly relates to a harmonic suppression circuit for tunneling magnetoresistance sensors.

Description of Related Art

In recent years, high-performance magnetic sensors widely used for magnetic field measurement include: anisotropic magnetoresistive sensors, giant magnetoresistive sensors, giant magnetoimpedance sensors, tunneling magnetoresistance sensors, fluxgate sensors, atom magnetometers and the like. These magnetic sensors adopt micron-sized to millimeter-sized magnetic probes and generally have the features of low power (milliwatt), wide measurement range and high reliability in use. However, although the magnetic sensors such as fluxgate sensors and atom magnetometers have the advantages of high sensitivity and low noise, they cannot overcome the defects of large size, high power and high cost. The tunneling magnetoresistance sensors manufactured by the multi-layer thin-film resistor process not only have high sensitivity and low noise, but also have the advantages of small size, low cost and low power, thus being widely applied to the automotive electronics, biomedicine, environment monitoring, IoT, smart phones and other civil fields. However, because the magnetic sensors need to be equipped with specific reading circuits to read sensing data according to their functions, the reading circuits of existing tunneling magnetoresistance sensors have the problem of harmonic distortion, compromising the linearity of the tunneling magnetoresistance sensors and leading to a low data reading accuracy. Harmonic distortion, as an important source for uncertainty or error analysis of measured signal values, is of great significance in performance evaluation of the tunneling magnetoresistance sensors. As a result, the application of existing tunneling magnetoresistance sensors to high-precision global positioning and navigation with a strict requirement for harmonic distortion (such as inertial navigation and positioning systems) is limited.

SUMMARY

The technical issue to be settled by the invention is to provide a harmonic suppression circuit for tunneling magnetoresistance sensors, which has a high linearity and has a high reading accuracy when used for reading sensing data of tunneling magnetoresistance sensors.

The technical solution adopted by the invention to settle the above technical issue is as follows: a harmonic suppression circuit for tunneling magnetoresistance sensors restrains even-order harmonic distortion by means of a fully differential interface circuit topological structure, restrains the charge injection and clock feedthrough effect of transistors by means of a virtual geminate transistor parallel structure and reduces the on resistance by means of a complementary switch structure to effectively restrain harmonic distortion.

The harmonic suppression circuit for tunneling magnetoresistance sensors comprises a chopping instrumentation amplifier and a second-order sigma-detla modulator, wherein the chopping instrumentation amplifier and the second-order sigma-detla modulator are implemented by a fully differential interface circuit topological structure and have a complementary switch structure and a virtual geminate transistor parallel structure respectively.

The chopping instrumentation amplifier has a positive input terminal, a negative input terminal, a positive output terminal and a negative output terminal, the second-order sigma-detla modulator has a positive input terminal, a negative input terminal, a positive output terminal and a negative output terminal, the positive input terminal and the negative input terminal of the chopping instrumentation amplifier are used as two input terminals of the harmonic suppression circuit for tunneling magnetoresistance sensors and are connected to two output terminals of a tunneling magnetoresistance sensor in one-to-one correspondence, the positive output terminal of the chopping instrumentation amplifier and the positive input terminal of the second-order sigma-detla modulator are connected, the negative output terminal of the chopping instrumentation amplifier and the negative input terminal of the second-order sigma-detla modulator are connected, and the positive output terminal and the negative output terminal of the second-order sigma-detla modulator are used as two output terminals of the harmonic suppression circuit for tunneling magnetoresistance sensors.

The chopping instrumentation amplifier comprises a first operational amplifier and eight CMOS complementary switches, wherein the CMOS complementary switch has two clock control terminals, a first connecting terminal and a second connecting terminal, a clock signal is input to the two clock control terminals of the CMOS complementary switch, and under the control of the clock signal input to the two clock control terminals of the CMOS complementary switch, the first connecting terminal and the second connecting terminal of the CMOS complementary switch are turned on or off; the eight CMOS complementary switches are referred to a first switch, a second switch, a third switch, a fourth switch, a fifth switch, a sixth switch, a seventh switch and an eighth switch respectively, the first operational amplifier adopts a fully differential folding common-source and common-gate structure and has a positive input terminal, a negative input terminal, a positive output terminal and a negative output terminal; the first connecting terminal of the first switch and the first connecting terminal of the second switch are connected and a connecting terminal is the positive input terminal of the chopping instrumentation amplifier, the first connecting terminal of the third switch and the first connecting terminal of the fourth switch are connected and a connecting terminal is the positive input terminal of the chopping instrumentation amplifier, the second connecting terminal of the first switch, the second connecting terminal of the third switch and the negative input terminal of the first operational amplifier are connected, the second connecting terminal of the second switch, the second connecting terminal of the fourth switch and the positive input terminal of the first operational amplifier are connected, the negative output terminal of the first operational amplifier, the first connecting terminal of the fifth switch and the first connecting terminal of the sixth switch are connected, the positive output terminal of the first operational amplifier, the first connecting terminal of the seventh switch and the first connecting terminal of the eighth switch are connected, the second connecting terminal of the fifth switch and the second connecting terminal of the seventh switch are connected and a connecting terminal is the positive output terminal of the chopping instrumentation amplifier, and the second connecting terminal of the sixth switch and the second connecting terminal of the eighth switch are connected and a connecting terminal is the negative output terminal of the chopping instrumentation amplifier.

The first operational amplifier comprises a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifth MOS transistor, a sixteenth MOS transistor, a seventeenth MOS transistor, an eighteenth MOS transistor, a nineteenth MOS transistor, a twelfth MOS transistor, a twenty-first MOS transistor, a twenty-second MOS transistor, a twenty-third MOS transistor, a twenty-fourth MOS transistor, a twenty-fifth MOS transistor, a twenty-sixth MOS transistor, a twenty-seventh MOS transistor, a twenty-eighth MOS transistor, a twenty-ninth MOS transistor, a thirtieth MOS transistor, a first virtual transistor, a second virtual transistor, a first capacitor, a second capacitor, a third capacitor, a fourth capacitor, a first resistor and a second resistor; the first MOS transistor, the second MOS transistor, the seventh MOS transistor, the eighth MOS transistor, the ninth MOS transistor, the tenth MOS transistor, the eleventh MOS transistor, the twelfth MOS transistor, the fifth MOS transistor, the sixteenth MOS transistor, the seventeenth MOS transistor, the twelfth MOS transistor, the twenty-first MOS transistor, the twenty-second MOS transistor, the twenty-third MOS transistor, the twenty-fourth MOS transistor, the twenty-fifth MOS transistor and the thirtieth MOS transistor are all NMOS transistors, the third MOS transistor, the fourth MOS transistor, the fifth MOS transistor, the sixth MOS transistor, the thirteenth MOS transistor, the fourteenth MOS transistor, the eighteenth MOS transistor, the nineteenth MOS transistor, the twenty-sixth MOS transistor, the twenty-seventh MOS transistor, the twenty-eighth MOS transistor and the twenty-ninth MOS transistor are all PMOS transistors, and the first virtual transistor and the second virtual transistor are both N-type virtual transistors; a gate of the first MOS transistor and a gate of the first virtual transistors are connected and a connecting terminal is the positive input terminal of the first operational amplifier, a source of the first MOS transistor and a drain of the first virtual transistor are connected, a drain of the first MOS transistor, a drain of the second MOS transistor and a source of the thirtieth MOS transistor are connected, a source of the first virtual transistor, a drain of the third MOS transistor and a source of the fifth MOS transistor are connected, a gate of the second MOS transistor and a gate of the second virtual transistor are connected and a connecting terminal is the negative input terminal of the first operational amplifier, a source of the second MOS transistor and a drain of the second virtual transistor are connected, a source of the second virtual transistor and one terminal of the second capacitor are connected, a gate of the third MOS transistor, a gate of the fourth MOS transistor, a gate and source of the twenty-fourth MOS transistor and a gate and source of the twenty-sixth MOS transistor are connected, a source of the third MOS transistor, a source of the seventh MOS transistor and a gate of the eleventh MOS transistor are connected, a drain of the fourth MOS transistor, a source of the sixth MOS transistor and one terminal of the first capacitor are connected, a source of the fourth MOS transistor, a source of the eighth MOS transistor and a gate of the twelfth MOS transistor are connected, a gate of the fifth MOS transistor, a gate of the sixth MOS transistor, a source of the sixteenth MOS transistor and a gate and source of the eighteenth MOS transistor are connected and a connecting terminal has a common-mode level Vcm accessed thereto, a drain of the fifth MOS transistor, a drain of the sixth MOS transistor, a drain of the thirteenth MOS transistor, a drain of the fourteenth MOS transistor, a drain of the eighteenth MOS transistor, a drain of the nineteenth MOS transistor, a drain of the twenty-seventh MOS transistor, a drain of the twenty-eighth MOS transistor and a drain of the twenty-ninth MOS transistor are connected and a connecting terminal is grounded Vss, a gate of the seventh MOS transistor, a gate of the eighth MOS transistor, a drain of the twenty-sixth MOS transistor, a gate of the twenty-eighth MOS transistor and a gate and source of the twenty-ninth MOS transistor are connected, a drain of the seventh MOS transistor and a source of the ninth MOS transistor are connected, a drain of the eighth MOS transistor and a source of the tenth MOS transistor are connected, a gate of the ninth MOS transistor, a gate of the tenth MOS transistor, a gate of the thirtieth MOS transistor, a gate of the fifteenth MOS transistor, a gate and source of the twentieth MOS transistor, a gate of the twenty-first MOS transistor, a gate of the twenty-second MOS transistor and a drain of the twenty-third MOS transistor are connected, a drain of the ninth MOS transistor, a drain of the tenth MOS transistor, a drain of the eleventh MOS transistor, a drain of the thirtieth MOS transistor, a drain of the twelfth MOS transistor, a drain of the fifteenth MOS transistor, a drain of the twentieth MOS transistor, a drain of the twenty-first MOS transistor and a drain of the twenty-second MOS transistor are connected and a connecting terminal has a supply voltage $V_{DD}$ accessed thereto, a source of the eleventh MOS transistor, the other terminal of the second capacitor, a source of the thirteenth MOS transistor, one terminal of the third capacitor and one terminal of the first resistor are connected and a connecting terminal is the positive output terminal of the first operational amplifier, a source of the twelfth MOS transistor, the other terminal of the first capacitor, a source of the fourteenth MOS transistor, one terminal of the fourth capacitor and one terminal of the second resistor are connected and a connecting terminal is the negative output terminal of the first operational amplifier, a gate of the thirteenth MOS transistor, a gate of the fourteenth MOS transistor, a source of the twenty-second MOS transistor and a drain of the twenty-fifth MOS transistor are connected, a source of the fifteenth MOS transistor, a drain of the sixteenth MOS transistor and a drain of the seventeenth MOS transistor are connected, a gate of the sixteenth MOS transistor, the other terminal of the third capacitor the other terminal of the first resistor, the other terminal of the fourth capacitor and the other terminal of the second resistor are connected, a source of the seventeenth MOS transistor and a gate and source of the nineteenth MOS transistor are connected, a reference voltage Vref is accessed to a gate of the seventeenth MOS transistor, a source of the twenty-first MOS transistor and a drain of the twenty-fourth MOS transistor are connected, a source of the twenty-third MOS transistor and a source of the twenty-eighth MOS transistor are connected, and a gate and source of the twenty-fifth MOS transistor and a gate and source of the twenty-seventh MOS transistor are connected.

The second-order sigma-detla modulator comprises a second operational amplifier, a third operational amplifier, a fifth capacitor, a sixth capacitor, a seventh capacitor, an eighth capacitor, a ninth capacitor, a tenth capacitor, an eleventh capacitor, a twelfth capacitor, a quantization comparator and three switched-capacitor circuits, wherein the second operational amplifier and the third operational amplifier adopt a fully differential folding common-source common-gate structure and each have a positive input terminal, a negative input terminal, a positive output terminal and a negative output terminal, the quantization comparator has a positive input terminal, a negative input terminal, a positive output terminal and a negative output terminal, the three switched-capacitor circuits are referred to a first switched-capacitor circuit, a second switched-capacitor circuit and a third switched-capacitor circuit respectively, the first switched-capacitor circuit and the second switched-capacitor circuit each have a positive input terminal, a negative input terminal, a positive output terminal and a negative output terminal, and the third switched-capacitor circuit has a positive input terminal, a negative input terminal, a positive feedback terminal, a negative feedback terminal, a positive output terminal and a negative output terminal; the positive input terminal of the first switched-capacitor circuit and one terminal of the eleventh capacitor are connected and a connecting terminal is the positive input terminal of the second-order sigma-detla modulator, the negative input terminal of the first switched-capacitor circuit and one terminal of the twelfth capacitor are connected and a connecting terminal is the negative input terminal of the second-order sigma-detla modulator, the positive output terminal of the first switched-capacitor circuit, one terminal of the fifth capacitor and the negative input terminal of the second operational amplifier are connected, the negative output terminal of the first switched-capacitor circuit, one terminal of the sixth capacitor and the positive input terminal of the second operational amplifier are connected, the other terminal of the fifth capacitor, the negative output terminal of the second operational amplifier, one terminal of the ninth capacitor and the positive input terminal of the second switched-capacitor circuit are connected, the other terminal of the sixth capacitor, the positive output terminal of the second operational amplifier, one terminal of the tenth capacitor and the negative input terminal of the second switched-capacitor circuit are connected, the positive output terminal of the second switched-capacitor circuit, one terminal of the seventh capacitor and the negative input terminal of the third operational amplifier are connected, the negative output terminal of the second switched-capacitor circuit, one terminal of the eighth capacitor and the positive input terminal of the third operational amplifier are connected, the other terminal of the seventh capacitor, the negative output terminal of the third operational amplifier and the positive input terminal of the third switched-capacitor circuit are connected, the other terminal of the eighth capacitor, the positive output terminal of the third operational amplifier and the negative input terminal of the third switched-capacitor circuit are connected, the other terminal of the ninth capacitor, the other terminal of the eleventh capacitor and the positive feedback terminal of the third switched-capacitor circuit are connected, the other terminal of the tenth capacitor, the other terminal of the twelfth capacitor and the negative feedback terminal of the third switched-capacitor circuit are connected, the positive output terminal of the third switched-capacitor circuit and the negative input terminal of the quantization comparator are connected, the negative output terminal of the third switched-capacitor circuit and the positive input terminal of the quantization comparator are connected, the negative output terminal of the quantization comparator is the negative output terminal of the second-order sigma-detla modulator, and the positive output terminal of the quantization comparator is the positive output terminal of the second-order sigma-detla modulator.

The first switched-capacitor circuit comprises a thirteenth capacitor, a fourteenth capacitor and eight CMOS complementary switches, wherein the eight CMOS complementary switches are referred to as a ninth switch, a tenth switch, an eleventh switch, a twelfth switch, a thirteenth switch, a fourteenth switch, a fifteenth switch and a sixteenth switch respectively, a first connecting terminal of the ninth switch is the positive input terminal of the first switched-capacitor circuit, a first connecting terminal of the eleventh switch is the negative input terminal of the first switched-capacitor circuit, a second connecting terminal of the ninth switch, a first connecting terminal of the fourteenth switch and one terminal of the thirteenth capacitor are connected, a second connecting terminal of the eleventh switch, a first connecting terminal of the sixteenth switch and one terminal of the fourteenth capacitor are connected, the other terminal of the thirteenth capacitor, a first connecting terminal of the thirteenth switch and a first connecting terminal of the tenth switch are connected, the other terminal of the fourteenth capacitor, a first connecting terminal of the twelfth switch and a first connecting terminal of the fifteenth switch are connected, a second connecting terminal of the tenth switch is the positive output terminal of the first switched-capacitor circuit, a second connecting terminal of the twelfth switch is the negative output terminal of the first switched-capacitor circuit, and the common-mode level Vcm is accessed to a second connecting terminal of the thirteenth switch, a second connecting terminal of the fourteenth switch, a second connecting terminal of the fifth switch and a second connecting terminal of the sixteenth switch; the structure of the second switched-capacitor circuit is completely identical with the structure of the first switched-capacitor circuit; and the structure of the third switched-capacitor circuit is basically the same as the structure of the first switched-capacitor circuit and is different from the structure of the first switched-capacitor circuit in that a connecting terminal of the other terminal of the thirteenth capacitor, the first connecting terminal of the thirteenth switch and the first connecting terminal of the tenth switch is the positive feedback terminal of the third switched-capacitor circuit, and a connecting terminal of the other terminal of the fourteenth capacitor, the first connecting terminal of the twelfth switch and the first connecting terminal of the fifteenth switch is the negative feedback terminal of the third switched-capacitor circuit.

The circuit structure of the second operational amplifier and the circuit structure of the third operational amplifier are the same as the circuit structure of the first operational amplifier.

Compared with the prior art, the invention has the following advantages: the harmonic suppression circuit for tunneling magnetoresistance sensors restrains even-order harmonic distortion by means of a fully differential interface circuit topological structure, restrains the charge injection and clock feedthrough effect of transistors by means of a virtual geminate transistor parallel structure and reduces the on resistance by means of a complementary switch structure to effectively restrain harmonic distortion, thus having a high linearity and having a high reading accuracy when used for reading sensing data of tunneling magnetoresistance sensors.

DESCRIPTION OF THE EMBODIMENTS

The invention is described in further detail below in conjunction with accompanying drawings and embodiments.

Embodiment 1: A harmonic suppression circuit for tunneling magnetoresistance sensors restrains even-order harmonic distortion by means of a fully differential interface circuit topological structure, restrains the charge injection and clock feedthrough effect of transistors by means of a virtual geminate transistor parallel structure and reduces the on resistance by means of a complementary switch structure to effectively restrain harmonic distortion.

Figure 1:
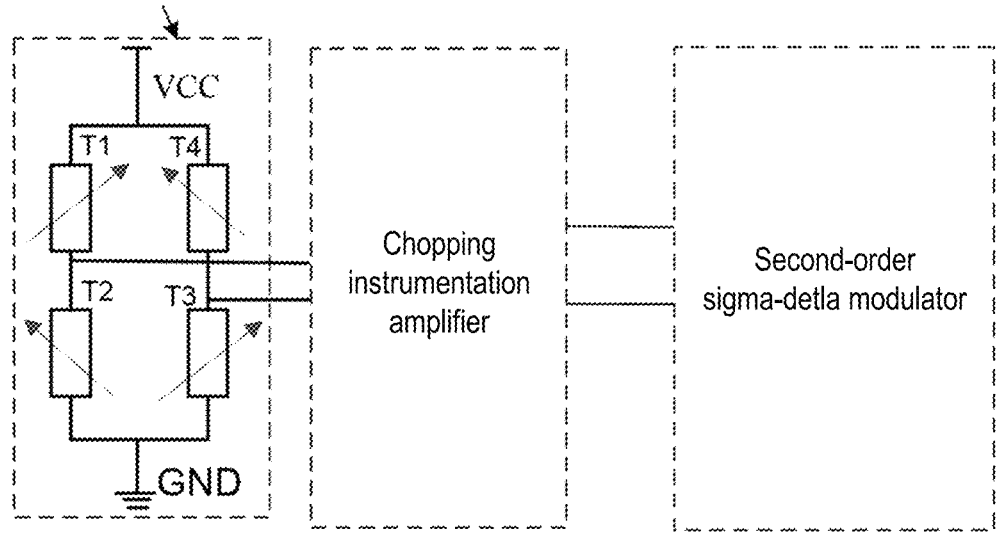
FIG. 1 is a schematic connection diagram of a harmonic suppression circuit for tunneling magnetoresistance sensors and a magnetoresistance sensor according to the invention.

As shown in FIG. 1, in this embodiment, the harmonic suppression circuit for tunneling magnetoresistance sensors comprises a chopping instrumentation amplifier and a second-order sigma-detla modulator, wherein the chopping instrumentation amplifier and the second-order sigma-detla modulator are implemented by a fully differential interface circuit topological structure and have a complementary switch structure and a virtual geminate transistor parallel structure respectively. The chopping instrumentation amplifier has a positive input terminal, a negative input terminal, a positive output terminal and a negative output terminal, the second-order sigma-detla modulator has a positive input terminal, a negative input terminal, a positive output terminal and a negative output terminal, the positive input terminal and the negative input terminal of the chopping instrumentation amplifier are used as two input terminals of the harmonic suppression circuit for tunneling magnetoresistance sensors and are connected to two output terminals of a tunneling magnetoresistance sensor in one-to-one correspondence, the positive output terminal of the chopping instrumentation amplifier and the positive input terminal of the second-order sigma-detla modulator are connected, the negative output terminal of the chopping instrumentation amplifier and the negative input terminal of the second-order sigma-detla modulator are connected, and the positive output terminal and the negative output terminal of the second-order sigma-detla modulator are used as two output terminals of the harmonic suppression circuit for tunneling magnetoresistance sensors.

In this embodiment, the tunneling magnetoresistance sensor generally adopts a push-pull Wheatstone bridge structure formed by four high-sensitivity magneto-sensitive resistors T1, T2, T3 and T4, such that the sensitivity of the tunneling magnetoresistance sensor can be improved, and common-mode signals can be effectively restrained. Wherein, a voltage VCC is accessed to one terminal of the high-sensitivity magneto-sensitive resistor T1 and one terminal of the high-sensitivity magneto-sensitive resistor T2, one terminal of the high-sensitivity magneto-sensitive resistor T3 and one terminal of the high-sensitivity magneto-sensitive resistor T4 are grounded GND, the other terminal of the high-sensitivity magneto-sensitive resistor T1 and the other terminal of the high-sensitivity magneto-sensitive resistor T2 are connected and a connecting terminal is a first output terminal of the tunneling magnetoresistance sensor, and the other terminal of the tunneling magnetoresistance sensor T3 and the other terminal of the tunneling magnetoresistance sensor T4 are connected and a connecting terminal is a second output terminal of the tunneling magnetoresistance sensor. Because the amplitude of analog voltage signals output by the two output terminals of the tunneling magnetoresistance sensor is generally within a millivolt range, the harmonic suppression circuit for tunneling magnetoresistance sensors in this embodiment first amplifies the analog voltage signals to an input signal range compatible with the back-end second-order sigma-detla modulator by means of a front-end reading circuit (the chopping instrumentation amplifier). The front-end reading circuit is implemented by the chopping instrumentation amplifier and can restrain low-frequency 1/f noise and offsets, thus improving the subsequent reading accuracy. In addition, the chopping instrumentation amplifier and the second-order sigma-detla modulator are implemented by the fully differential interface circuit topological structure and have the complementary switch structure and the virtual geminate transistor parallel structure respectively, wherein the fully differential interface circuit topological structure can restrain even-order harmonic distortion, the virtual geminate transistor parallel structure can restrain the charge injection and clock feedthrough effect of transistors, and the complementary switch structure can reduce the on resistance, such that harmonic distortion is effectively restrained to guarantee that the harmonic suppression circuit for tunneling magnetoresistance sensors has a high linearity and has a high reading accuracy when used for reading sensing data of the tunneling magnetoresistance sensor.

Figure 2:
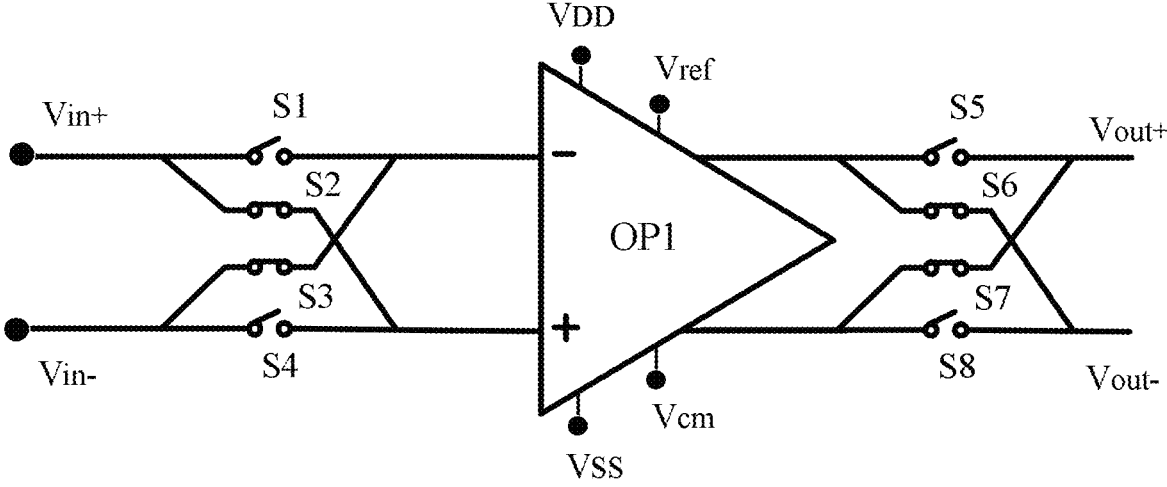
FIG. 2 is a circuit diagram of a chopping instrumentation amplifier of the harmonic suppression circuit for tunneling magnetoresistance sensors according to the invention.

Embodiment 2: This embodiment is basically the same as Embodiment 1 and is different from Embodiment 1 in the following aspect: as shown in FIG. 2, in this embodiment, the chopping instrumentation amplifier comprises a first operational amplifier OP1 and eight CMOS complementary switches, wherein the CMOS complementary switch has two clock control terminals, a first connecting terminal and a second connecting terminal, a clock signal is input to the two clock control terminals of the CMOS complementary switch, and under the control of the clock signal input to the two clock control terminals of the CMOS complementary switch, the first connecting terminal and the second connecting terminal of the CMOS complementary switch are turned on or off; the CMOS complementary switch is formed by a PMOS transistor and an NMOS transistor, a drain of the PMOS transistor and a source of the NMOS transistor are connected and a connecting terminal is the first connecting terminal of the CMOS complementary switch, a source of the PMOS transistor and a drain of the NMOS transistor are connected and a connecting terminal is the second connecting terminal of the CMOS complementary switch, and a gate of the PMOS transistor and a gate of the NMOS transistor are the two clock control terminals of the CMOS complementary switch; the eight CMOS complementary switches are referred to a first switch S1, a second switch S2, a third switch S3, a fourth switch S4, a fifth switch S5, a sixth switch S6, a seventh switch S7 and an eighth switch S8 respectively, the first operational amplifier OP1 adopts a fully differential folding common-source and common-gate structure and has a positive input terminal, a negative input terminal, a positive output terminal and a negative output terminal; the first connecting terminal of the first switch S1 and the first connecting terminal of the second switch S2 are connected and a connecting terminal is the positive input terminal of the chopping instrumentation amplifier, the first connecting terminal of the third switch S3 and the first connecting terminal of the fourth switch S4 are connected and a connecting terminal is the positive input terminal of the chopping instrumentation amplifier, the second connecting terminal of the first switch S1, the second connecting terminal of the third switch S3 and the negative input terminal of the first operational amplifier OP1 are connected, the second connecting terminal of the second switch S2, the second connecting terminal of the fourth switch S4 and the positive input terminal of the first operational amplifier OP1 are connected, the negative output terminal of the first operational amplifier OP1, the first connecting terminal of the fifth switch S5 and the first connecting terminal of the sixth switch S6 are connected, the positive output terminal of the first operational amplifier OP1, the first connecting terminal of the seventh switch S7 and the first connecting terminal of the eighth switch S8 are connected, the second connecting terminal of the fifth switch S5 and the second connecting terminal of the seventh switch S7 are connected and a connecting terminal is the positive output terminal of the chopping instrumentation amplifier, and the second connecting terminal of the sixth switch S6 and the second connecting terminal of the eighth switch S8 are connected and a connecting terminal is the negative output terminal of the chopping instrumentation amplifier.

In the chopping instrumentation amplifier in this embodiment, the first switch S1, the second switch S2, the third switch S3 and the fourth switch S4 function as chopping switches, and the fifth switch S5, the sixth switch S6, the seventh switch S7 and the eighth switch S8 function as demodulation switches; when the tunneling magnetoresistance sensor outputs a signal (an original signal) to the chopping instrumentation amplifier, the original signal is modulated to a high frequency by the first switch S1, the second switch S2, the third switch S3 and the fourth switch S4, then amplified by the first operational amplifier OP1 and finally demodulated to the of the original signal by the fifth switch S5, the sixth switch S6, the seventh switch S7 and the eighth switch S8, such that chopping amplification of the original signal is realized. Because the first operational amplifier OP1 adopts the fully differential folding common-source and common-gate structure, a chopping module formed by the first switch S1, the second switch S2, the third switch S3 and the fourth switch S4 is a differential structure, a demodulation module formed by the fifth switch S5, the sixth switch S6, the seventh switch S7 and the eighth switch S8 is also a differential structure, and the chopping instrumentation amplifier adopts the fully differential topological structure, such that even-order harmonic in the signal transmission process can be effectively restrained to reduce harmonic distortion.

Figure 3:
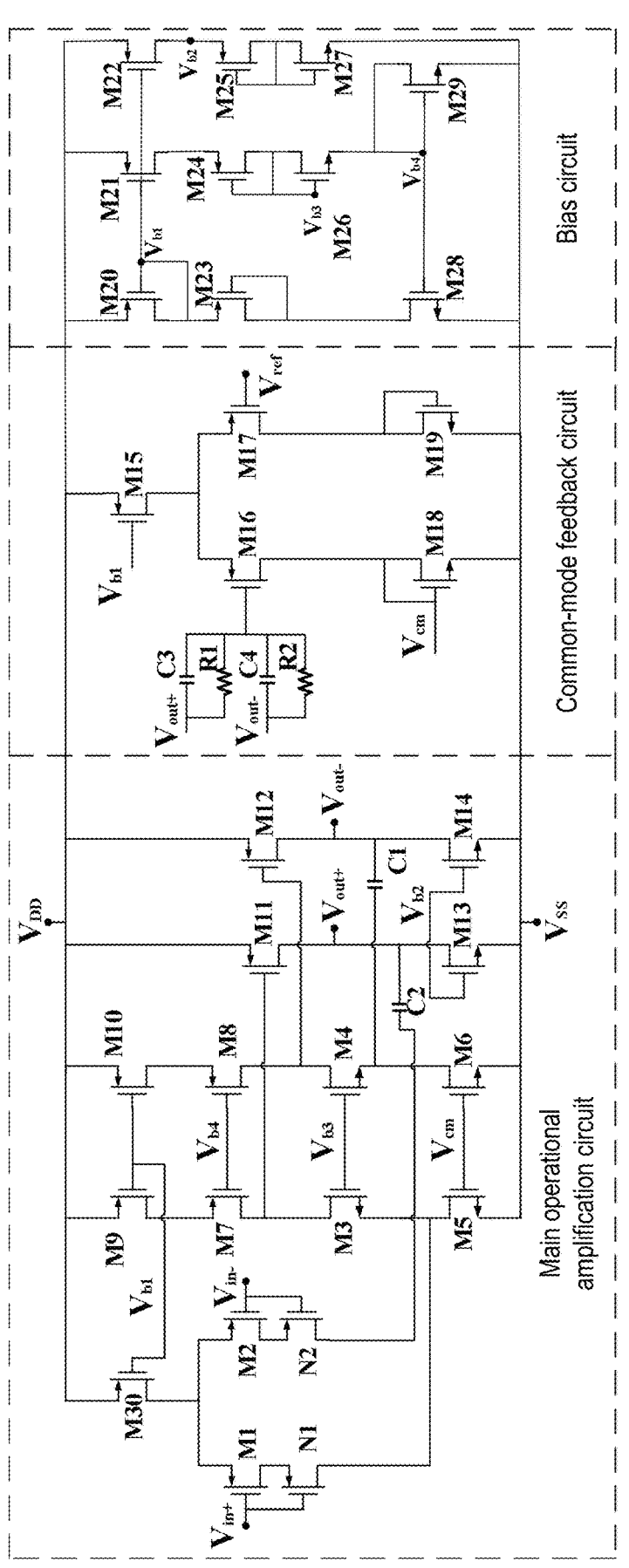
FIG. 3 is a circuit diagram of a first operational amplifier, a second operational amplifier and a third operational amplifier of the harmonic suppression circuit for tunneling magnetoresistance sensors according to the invention.

As shown in FIG. 3, in this embodiment, the first operational amplifier OP1 comprises a first MOS transistor M1, a second MOS transistor M2, a third MOS transistor M3, a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, a thirteenth MOS transistor M13, a fourteenth MOS transistor M14, a fifth MOS transistor M15, a sixteenth MOS transistor M16, a seventeenth MOS transistor M17, an eighteenth MOS transistor M18, a nineteenth MOS transistor M19, a twelfth MOS transistor M20, a twenty-first MOS transistor M21, a twenty-second MOS transistor M22, a twenty-third MOS transistor M23, a twenty-fourth MOS transistor M24, a twenty-fifth MOS transistor M25, a twenty-sixth MOS transistor M26, a twenty-seventh MOS transistor M27, a twenty-eighth MOS transistor M28, a twenty-ninth MOS transistor M29, a thirtieth MOS transistor M30, a first virtual transistor N1, a second virtual transistor N2, a first capacitor C1, a second capacitor C2, a third capacitor C3, a fourth capacitor C4, a first resistor R1 and a second resistor R2; the first MOS transistor M1, the second MOS transistor M2, the seventh MOS transistor M7, the eighth MOS transistor M8, the ninth MOS transistor M9, the tenth MOS transistor M10, the eleventh MOS transistor M11, the twelfth MOS transistor M12, the fifth MOS transistor M15, the sixteenth MOS transistor M16, the seventeenth MOS transistor M17, the twelfth MOS transistor M20, the twenty-first MOS transistor M21, the twenty-second MOS transistor M22, the twenty-third MOS transistor M23, the twenty-fourth MOS transistor M24, the twenty-fifth MOS transistor M25 and the thirtieth MOS transistor M30 are all NMOS transistors, the third MOS transistor M3, the fourth MOS transistor M4, the fifth MOS transistor M5, the sixth MOS transistor M6, the thirteenth MOS transistor M13, the fourteenth MOS transistor M14, the eighteenth MOS transistor M18, the nineteenth MOS transistor M19, the twenty-sixth MOS transistor M26, the twenty-seventh MOS transistor M27, the twenty-eighth MOS transistor M28 and the twenty-ninth MOS transistor M29 are all PMOS transistors, and the first virtual transistor N1 and the second virtual transistor N2 are both N-type virtual transistors; a gate of the first MOS transistor M1 and a gate of the first virtual transistors N1 are connected and a connecting terminal is the positive input terminal of the first operational amplifier OP1, a source of the first MOS transistor M1 and a drain of the first virtual transistor N1 are connected, a drain of the first MOS transistor M1, a drain of the second MOS transistor M2 and a source of the thirtieth MOS transistor M30 are connected, a source of the first virtual transistor N1, a drain of the third MOS transistor M3 and a source of the fifth MOS transistor M5 are connected, a gate of the second MOS transistor M2 and a gate of the second virtual transistor N2 are connected and a connecting terminal is the negative input terminal of the first operational amplifier OP1, a source of the second MOS transistor M2 and a drain of the second virtual transistor N2 are connected, a source of the second virtual transistor N2 and one terminal of the second capacitor C2 are connected, a gate of the third MOS transistor M3, a gate of the fourth MOS transistor M4, a gate and source of the twenty-fourth MOS transistor M24 and a gate and source of the twenty-sixth MOS transistor M26 are connected, a source of the third MOS transistor M3, a source of the seventh MOS transistor M7 and a gate of the eleventh MOS transistor M11 are connected, a drain of the fourth MOS transistor M4, a source of the sixth MOS transistor M6 and one terminal of the first capacitor C1 are connected, a source of the fourth MOS transistor M4, a source of the eighth MOS transistor M8 and a gate of the twelfth MOS transistor M12 are connected, a gate of the fifth MOS transistor M5, a gate of the sixth MOS transistor M6, a source of the sixteenth MOS transistor M16 and a gate and source of the eighteenth MOS transistor M18 are connected and a connecting terminal has a common-mode level Vcm accessed thereto, a drain of the fifth MOS transistor M5, a drain of the sixth MOS transistor M6, a drain of the thirteenth MOS transistor M13, a drain of the fourteenth MOS transistor M14, a drain of the eighteenth MOS transistor M18, a drain of the nineteenth MOS transistor M19, a drain of the twenty-seventh MOS transistor M27, a drain of the twenty-eighth MOS transistor M28 and a drain of the twenty-ninth MOS transistor M29 are connected and a connecting terminal is grounded Vss, a gate of the seventh MOS transistor M7, a gate of the eighth MOS transistor M8, a drain of the twenty-sixth MOS transistor M26, a gate of the twenty-eighth MOS transistor M28 and a gate and source of the twenty-ninth MOS transistor M29 are connected, a drain of the seventh MOS transistor M7 and a source of the ninth MOS transistor M9 are connected, a drain of the eighth MOS transistor M8 and a source of the tenth MOS transistor M10 are connected, a gate of the ninth MOS transistor M9, a gate of the tenth MOS transistor M10, a gate of the thirtieth MOS transistor M30, a gate of the fifteenth MOS transistor M15, a gate and source of the twentieth MOS transistor M20, a gate of the twenty-first MOS transistor M21, a gate of the twenty-second MOS transistor M22 and a drain of the twenty-third MOS transistor M23 are connected, a drain of the ninth MOS transistor M9, a drain of the tenth MOS transistor M10, a drain of the eleventh MOS transistor M11, a drain of the thirtieth MOS transistor M30, a drain of the twelfth MOS transistor M12, a drain of the fifteenth MOS transistor M15, a drain of the twentieth MOS transistor M20, a drain of the twenty-first MOS transistor M21 and a drain of the twenty-second MOS transistor M22 are connected and a connecting terminal has a supply voltage $V_{DD}$ accessed thereto, a source of the eleventh MOS transistor M11, the other terminal of the second capacitor C2, a source of the thirteenth MOS transistor M13, one terminal of the third capacitor C3 and one terminal of the first resistor R1 are connected and a connecting terminal is the positive output terminal of the first operational amplifier OP1, a source of the twelfth MOS transistor M12, the other terminal of the first capacitor C1, a source of the fourteenth MOS transistor M14, one terminal of the fourth capacitor C4 and one terminal of the second resistor R2 are connected and a connecting terminal is the negative output terminal of the first operational amplifier OP1, a gate of the thirteenth MOS transistor M13, a gate of the fourteenth MOS transistor M14, a source of the twenty-second MOS transistor M22 and a drain of the twenty-fifth MOS transistor M25 are connected, a source of the fifteenth MOS transistor M15, a drain of the sixteenth MOS transistor M16 and a drain of the seventeenth MOS transistor M17 are connected, a gate of the sixteenth MOS transistor M16, the other terminal of the third capacitor C3, the other terminal of the first resistor R1, the other terminal of the fourth capacitor C4 and the other terminal of the second resistor R2 are connected, a source of the seventeenth MOS transistor M17 and a gate and source of the nineteenth MOS transistor M19 are connected, a reference voltage Vref is accessed to a gate of the seventeenth MOS transistor M17, a source of the twenty-first MOS transistor M21 and a drain of the twenty-fourth MOS transistor M24 are connected, a source of the twenty-third MOS transistor M23 and a source of the twenty-eighth MOS transistor M28 are connected, and a gate and source of the twenty-fifth MOS transistor M25 and a gate and source of the twenty-seventh MOS transistor M27 are connected.

In this embodiment, to avoid output harmonic distortion caused by the nonlinearity of the operational amplifier to obtain a high gain and a large output amplitude, the first operational amplifier OP1 adopts the fully differential folding common-source and common-gate structure, wherein the first MOS transistor M1, the second MOS transistor M2, the third MOS transistor M3, the fourth MOS transistor M4, the fifth MOS transistor M5, the sixth MOS transistor M6, the seventh MOS transistor M7, the eighth MOS transistor M8, the ninth MOS transistor M9, the tenth MOS transistor M10, the eleventh MOS transistor M11, the twelfth MOS transistor M12, the thirteenth MOS transistor M13, the fourteenth MOS transistor M14, the thirtieth MOS transistor M30, the first virtual transistor N1, the second virtual transistor N2, the first capacitor C1 and the second capacitor C3 form a main operational amplification circuit which is a folding common-source and common-gate structure, a PMOS differential geminate transistor formed by the first MOS transistor M1 and the second MOS transistor M2 is used as an input, and a geminate transistor parallel connection method (a parallel structure formed by the first virtual transistor N1 and the second virtual transistor N2) is used to restrain the charge injection and clock feedthrough effect of transistors, such that harmonic distortion is effectively restrained; a common-source and common-gate structure formed by the eleventh MOS transistor M11, the twelfth MOS transistor M12, the thirteenth MOS transistor M13 and the fourteenth MOS transistor M14 is used as a load to improve the operational amplification gain; the fifth MOS transistor M15, the sixteenth MOS transistor M16, the seventeenth MOS transistor M17, the eighteenth MOS transistor M18, the nineteenth MOS transistor M19, the third capacitor C3, the fourth capacitor C4, the first resistor R1 and the second resistor R2 form a common-mode feedback circuit which adopts a common-source structure to increase the output voltage swing, for a fully differential operational amplifier, a common-mode feedback circuit is added, a capacitor-resistor network formed by the third capacitor C3, the fourth capacitor C4, the first resistor R1 and the second resistor R2 is sued to detect the common-mode level Vcm and compares the common-mode level Vcm with the reference level Vref, and finally, a common-mode output deviation is fed back to a main operational amplifier by an error amplifier formed by the sixteenth MOS transistor M16 and the seventeenth MOS transistor M17, such that an output common-mode level is stabilized at a fixed potential; and the twelfth MOS transistor M20, the twenty-first MOS transistor M21, the twenty-second MOS transistor M22, the twenty-third MOS transistor M23, the twenty-fourth MOS transistor M24, the twenty-fifth MOS transistor M25, the twenty-sixth MOS transistor M26, the twenty-seventh MOS transistor M27, the twenty-eighth MOS transistor M28 and the twenty-ninth MOS transistor M29 form a bias circuit, which provides a bias voltage for the first operational amplifier OP1 to guarantee the each transistor in the first operational amplifier OP1 can operate normally.

Figure 4:
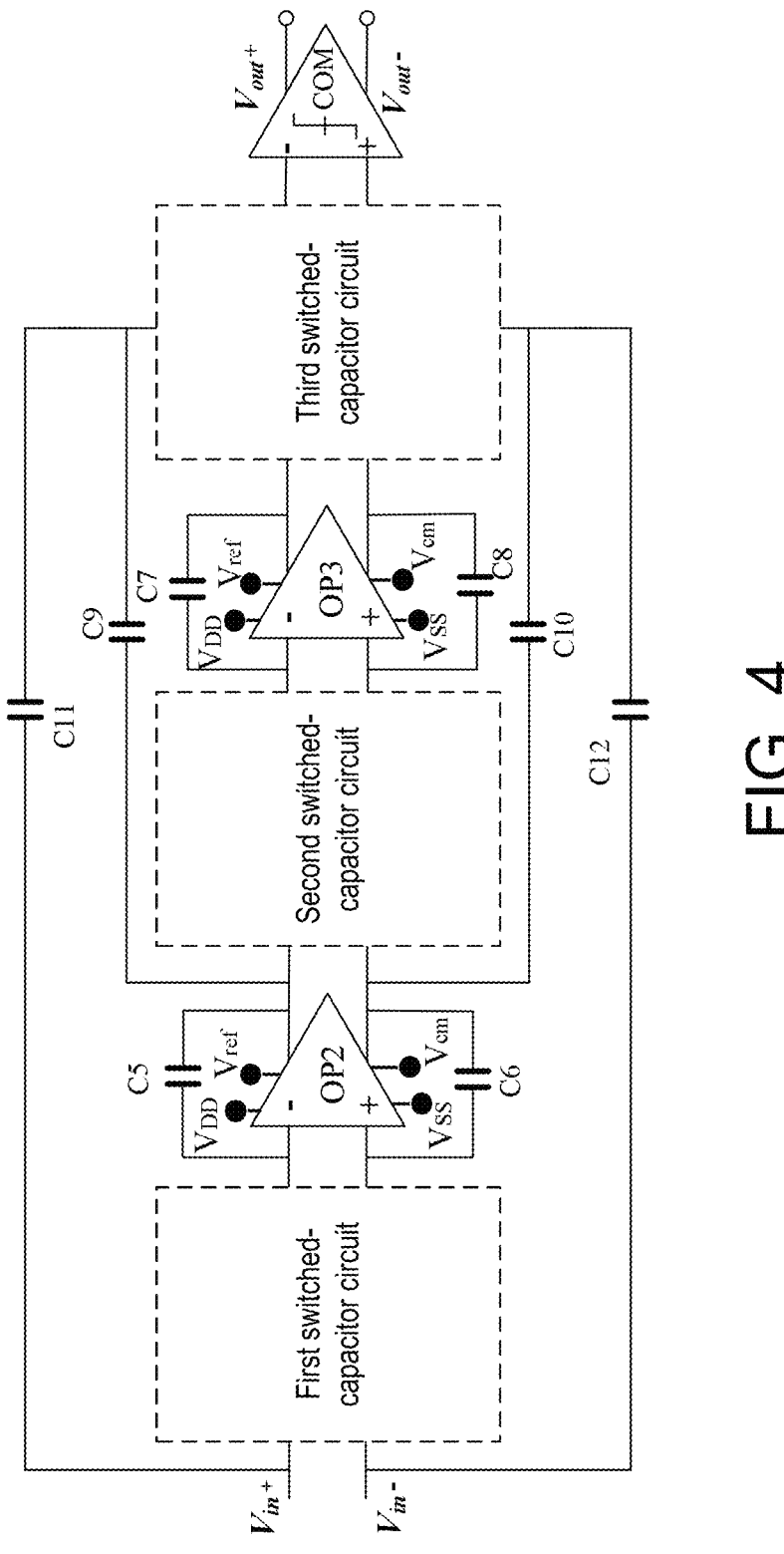
FIG. 4 is a circuit diagram of a second-order sigma-detla modulator of the harmonic suppression circuit for tunneling magnetoresistance sensors according to the invention.

Embodiment 3: This embodiment is basically the same as Embodiment 1 and is different from Embodiment 1 in the following aspect: as shown in FIG. 4, in this embodiment, the second-order sigma-detla modulator comprises a second operational amplifier OP2, a third operational amplifier OP3, a fifth capacitor C5, a sixth capacitor C6, a seventh capacitor C7, an eighth capacitor C8, a ninth capacitor C9, a tenth capacitor C10, an eleventh capacitor C11, a twelfth capacitor C12, a quantization comparator COM and three switched-capacitor circuits, wherein the second operational amplifier OP2 and the third operational amplifier OP3 adopt a fully differential folding common-source common-gate structure and each have a positive input terminal, a negative input terminal, a positive output terminal and a negative output terminal, the quantization comparator COM has a positive input terminal, a negative input terminal, a positive output terminal and a negative output terminal, the three switched-capacitor circuits are referred to a first switched-capacitor circuit, a second switched-capacitor circuit and a third switched-capacitor circuit respectively, the first switched-capacitor circuit and the second switched-capacitor circuit each have a positive input terminal, a negative input terminal, a positive output terminal and a negative output terminal, and the third switched-capacitor circuit has a positive input terminal, a negative input terminal, a positive feedback terminal, a negative feedback terminal, a positive output terminal and a negative output terminal; the positive input terminal of the first switched-capacitor circuit and one terminal of the eleventh capacitor C11 are connected and a connecting terminal is the positive input terminal of the second-order sigma-detla modulator, the negative input terminal of the first switched-capacitor circuit and one terminal of the twelfth capacitor C12 are connected and a connecting terminal is the negative input terminal of the second-order sigma-detla modulator, the positive output terminal of the first switched-capacitor circuit, one terminal of the fifth capacitor C5 and the negative input terminal of the second operational amplifier OP2 are connected, the negative output terminal of the first switched-capacitor circuit, one terminal of the sixth capacitor C6 and the positive input terminal of the second operational amplifier OP2 are connected, the other terminal of the fifth capacitor C5, the negative output terminal of the second operational amplifier OP2, one terminal of the ninth capacitor C9 and the positive input terminal of the second switched-capacitor circuit are connected, the other terminal of the sixth capacitor C6, the positive output terminal of the second operational amplifier OP2, one terminal of the tenth capacitor C10 and the negative input terminal of the second switched-capacitor circuit are connected, the positive output terminal of the second switched-capacitor circuit, one terminal of the seventh capacitor C7 and the negative input terminal of the third operational amplifier OP3 are connected, the negative output terminal of the second switched-capacitor circuit, one terminal of the eighth capacitor C8 and the positive input terminal of the third operational amplifier OP3 are connected, the other terminal of the seventh capacitor C7, the negative output terminal of the third operational amplifier OP3 and the positive input terminal of the third switched-capacitor circuit are connected, the other terminal of the eighth capacitor C8, the positive output terminal of the third operational amplifier OP3 and the negative input terminal of the third switched-capacitor circuit are connected, the other terminal of the ninth capacitor C9, the other terminal of the eleventh capacitor C11 and the positive feedback terminal of the third switched-capacitor circuit are connected, the other terminal of the tenth capacitor C10, the other terminal of the twelfth capacitor C12 and the negative feedback terminal of the third switched-capacitor circuit are connected, the positive output terminal of the third switched-capacitor circuit and the negative input terminal of the quantization comparator COM are connected, the negative output terminal of the third switched-capacitor circuit and the positive input terminal of the quantization comparator COM are connected, the negative output terminal of the quantization comparator COM is the negative output terminal of the second-order sigma-detla modulator, and the positive output terminal of the quantization comparator COM is the positive output terminal of the second-order sigma-detla modulator.

Figure 5:
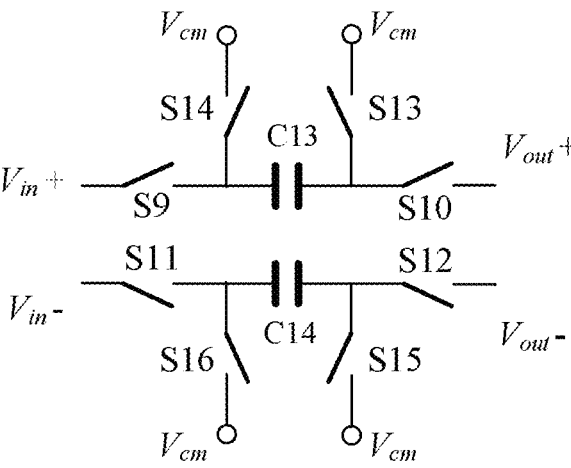
FIG. 5 is a circuit diagram of a first switched-capacitor circuit of the harmonic suppression circuit for tunneling magnetoresistance sensors according to the invention.
Figure 6:
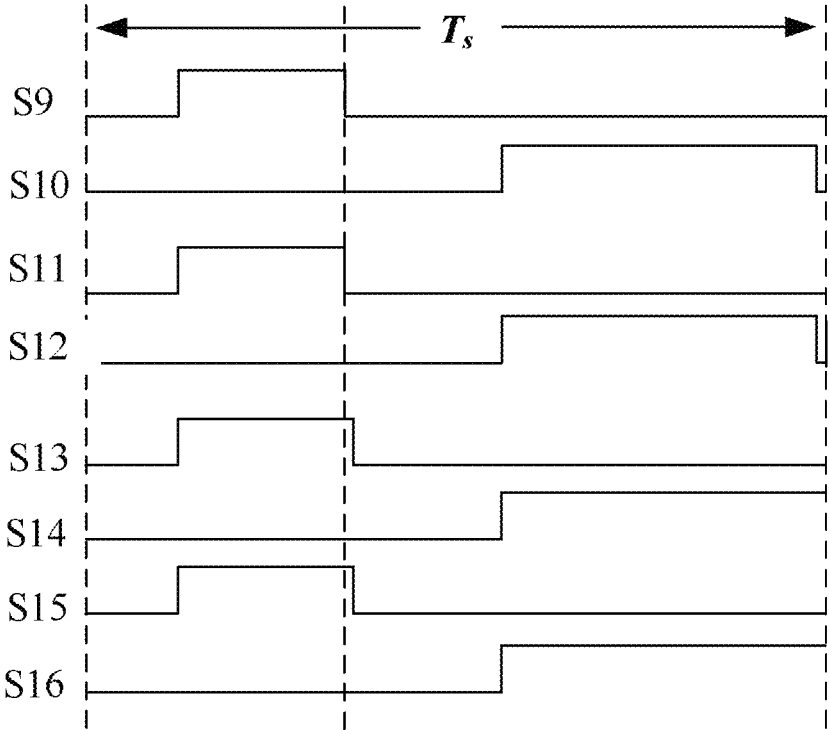
FIG. 6 is a simulated diagram of the operating state of switches in the first switched-capacitor circuit of the harmonic suppression circuit for tunneling magnetoresistance sensors according to the invention.

In this embodiment, as shown in FIG. 5, the first switched-capacitor circuit comprises a thirteenth capacitor C13, a fourteenth capacitor C14 and eight CMOS complementary switches, wherein the eight CMOS complementary switches are referred to as a ninth switch S9, a tenth switch S10, an eleventh switch S11, a twelfth switch S12, a thirteenth switch S13, a fourteenth switch S14, a fifteenth switch S15 and a sixteenth switch S16 respectively, a first connecting terminal of the ninth switch S9 is the positive input terminal of the first switched-capacitor circuit, a first connecting terminal of the eleventh switch S11 is the negative input terminal of the first switched-capacitor circuit, a second connecting terminal of the ninth switch S9, a first connecting terminal of the fourteenth switch S14 and one terminal of the thirteenth capacitor C13 are connected, a second connecting terminal of the eleventh switch S11, a first connecting terminal of the sixteenth switch S16 and one terminal of the fourteenth capacitor C14 are connected, the other terminal of the thirteenth capacitor C13, a first connecting terminal of the thirteenth switch S13 and a first connecting terminal of the tenth switch S10 are connected, the other terminal of the fourteenth capacitor C14, a first connecting terminal of the twelfth switch S12 and a first connecting terminal of the fifteenth switch S15 are connected, a second connecting terminal of the tenth switch S10 is the positive output terminal of the first switched-capacitor circuit, a second connecting terminal of the twelfth switch S12 is the negative output terminal of the first switched-capacitor circuit, and the common-mode level Vcm is accessed to a second connecting terminal of the thirteenth switch S13, a second connecting terminal of the fourteenth switch S14, a second connecting terminal of the fifth switch S15 and a second connecting terminal of the sixteenth switch S16. The structure of the second switched-capacitor circuit is completely identical with the structure of the first switched-capacitor circuit. The structure of the third switched-capacitor circuit is basically the same as the structure of the first switched-capacitor circuit and is different from the structure of the first switched-capacitor circuit in that a connecting terminal of the other terminal of the thirteenth capacitor C13, the first connecting terminal of the thirteenth switch S13 and the first connecting terminal of the tenth switch S10 is the positive feedback terminal of the third switched-capacitor circuit, and a connecting terminal of the other terminal of the fourteenth capacitor C14, the first connecting terminal of the twelfth switch S12 and the first connecting terminal of the fifteenth switch S15 is the negative feedback terminal of the third switched-capacitor circuit.

In this embodiment, the on resistance of the switched-capacitor circuits of the second-order sigma-delta modulator is nonlinear, the channel charge injection effect generated when the switched-capacitor circuits are turned off will also lead to nonlinearity, and the use of the CMOS complementary switches can improve the linearity to a great extent.

In this embodiment, the circuit structure of the second operational amplifier OP2 and the circuit structure of the third operational amplifier OP3 are the same as the circuit structure of the first operational amplifier OP1.

In the second-order sigma-detla modulator in this embodiment, the first switched-capacitor circuit, the second operational amplifier OP2, the fifth capacitor C5 and the sixth capacitor C6 form a first-stage integrator, the second switched-capacitor circuit, the third operational amplifier OP3, the seventh capacitor C7 and the eighth capacitor C form a second-stage integrator, and the first-stage integrator and the second integrator are identical in structure and operating state and both adopts a fully differential structure, thus being able to restrain even-order harmonic and the parasitic capacitance effect to better improving the linearity. The operating process of the first-stage integrator is as follows: the ninth switch S9 and the eleventh switch S11 of the first-stage integrator are controlled by a same clock phase, the tenth switch S10 and the twelfth switch S12 of the first-stage integrator are controlled by a same clock phase, the thirteenth switch S13 and the fifteenth switch S15 of the first-stage integrator are controlled by a same clock phase, and the fourteenth switch S14 and the sixteenth switch S16 of the first-stage integrator are controlled by a same clock phase; when the ninth switch S9 and the eleventh switch S11 are turned on, the thirteenth capacitor C13 and the fourteenth capacitor C14 function as sampling capacitors to sample signals; at the sampling stage, charges on the thirteenth capacitor C13 and the fourteenth capacitor C14 are 0; and after sampling is completed, an input signal is stored in the thirteenth capacitor C13 and the fourteenth capacitor C14, and a phase delay of the thirteenth switch S13 and the fifteenth switch S15 is later than a phase delay of the ninth switch S9 and the eleventh switch S11, such that errors of an integration result caused by the charge injection effect when the ninth switch S9 and the eleventh switch S11 are turned off can be avoided, thus improving the linearity. At the end of the sampling stage, the ninth switch S9 and the eleventh switch S11 are turned off first, and at this moment, the charge injection effect caused when the thirteenth switch S13 and the fifteenth switch S15 are turned off will not change the quantity of charges on the thirteenth capacitor C13 and the fourteenth capacitor C14, thus avoiding sampling errors. The first-stage integrator enters the integration stage after the sampling stage is completed, the tenth switch S10 and the twelfth switch S12 which function as integration switches are turned on, the charges are transferred from the thirteenth capacitor C13 and the fourteenth capacitor C14 to the fifth capacitor C5 and the sixth capacitor C6 which function as integration capacitors under the closed-loop feedback effect of the second operational amplifier OP2, such that an integral operation is implemented finally; at the end of the integration stage, the tenth switch S10 and the twelfth switch S12 are turned off, the integration capacitors (the fifth capacitor C5 and the sixth capacitor C6) and the sampling capacitors (the thirteenth capacitor C13 and the fourteenth capacitor C14) are disconnected, such that primary integration is realized. After the second-stage integrator performs secondary integration on a signal output by the first-stage integrator, the signal is output to the third switched-capacitor circuit, and the third switched-capacitor circuit performs sampling based on the same principle as the first switched-capacitor circuit, a sampling result is output by a quantizer, and during the operating process of the third switched-capacitor circuit, a feedback signal will be generated to be fed back to the input terminals of the first-stage integrator and the second-stage integrator.

What is claimed is:

1. A harmonic suppression circuit for tunneling magnetoresistance sensors, wherein the harmonic suppression circuit for tunneling magnetoresistance sensors is configured to restrain even-order harmonic distortion by means of a fully differential interface circuit topological structure, restrain the charge injection and clock feedthrough effect of transistors by means of a virtual geminate transistor parallel structure and reduce the on resistance by means of a complementary switch structure to effectively restrain harmonic distortion.

2. A harmonic suppression circuit for tunneling magnetoresistance sensors according to claim 1, comprises a chopping instrumentation amplifier and a second-order sigma-detla modulator, wherein the chopping instrumentation amplifier and the second-order sigma-detla modulator are implemented by a fully differential interface circuit topological structure and have a complementary switch structure and a virtual geminate transistor parallel structure respectively.

3. A harmonic suppression circuit for tunneling magnetoresistance sensors according to claim 2, wherein the chopping instrumentation amplifier comprises a positive input terminal, a negative input terminal, a positive output terminal and a negative output terminal, the second-order sigma-detla modulator comprises a positive input terminal, a negative input terminal, a positive output terminal and a negative output terminal, the positive input terminal and the negative input terminal of the chopping instrumentation amplifier are used as two input terminals of the harmonic suppression circuit for tunneling magnetoresistance sensors and are connected to two output terminals of a tunneling magnetoresistance sensor in one-to-one correspondence, the positive output terminal of the chopping instrumentation amplifier and the positive input terminal of the second-order sigma-detla modulator are connected, the negative output terminal of the chopping instrumentation amplifier and the negative input terminal of the second-order sigma-detla modulator are connected, and the positive output terminal and the negative output terminal of the second-order sigma-detla modulator are used as two output terminals of the harmonic suppression circuit for tunneling magnetoresistance sensors.

4. A harmonic suppression circuit for tunneling magnetoresistance sensors according to claim 3, wherein the chopping instrumentation amplifier comprises a first operational amplifier and eight CMOS complementary switches, wherein the CMOS complementary switch has two clock control terminals, a first connecting terminal and a second connecting terminal, a clock signal is input to the two clock control terminals of the CMOS complementary switch, and under the control of the clock signal input to the two clock control terminals of the CMOS complementary switch, the first connecting terminal and the second connecting terminal of the CMOS complementary switch are turned on or off; the eight CMOS complementary switches are referred to a first switch, a second switch, a third switch, a fourth switch, a fifth switch, a sixth switch, a seventh switch and an eighth switch respectively, the first operational amplifier adopts a fully differential folding common-source and common-gate structure and has a positive input terminal, a negative input terminal, a positive output terminal and a negative output terminal;

wherein the first connecting terminal of the first switch and the first connecting terminal of the second switch are connected and a connecting terminal is the positive input terminal of the chopping instrumentation amplifier, the first connecting terminal of the third switch and the first connecting terminal of the fourth switch are connected and a connecting terminal is the positive input terminal of the chopping instrumentation amplifier, the second connecting terminal of the first switch, the second connecting terminal of the third switch and the negative input terminal of the first operational amplifier are connected, the second connecting terminal of the second switch, the second connecting terminal of the fourth switch and the positive input terminal of the first operational amplifier are connected, the negative output terminal of the first operational amplifier, the first connecting terminal of the fifth switch and the first connecting terminal of the sixth switch are connected, the positive output terminal of the first operational amplifier, the first connecting terminal of the seventh switch and the first connecting terminal of the eighth switch are connected, the second connecting terminal of the fifth switch and the second connecting terminal of the seventh switch are connected and a connecting terminal is the positive output terminal of the chopping instrumentation amplifier, and the second connecting terminal of the sixth switch and the second connecting terminal of the eighth switch are connected and a connecting terminal is the negative output terminal of the chopping instrumentation amplifier.

5. A harmonic suppression circuit for tunneling magnetoresistance sensors according to claim 4, wherein the first operational amplifier comprises a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifth MOS transistor, a sixteenth MOS transistor, a seventeenth MOS transistor, an eighteenth MOS transistor, a nineteenth MOS transistor, a twelfth MOS transistor, a twenty-first MOS transistor, a twenty-second MOS transistor, a twenty-third MOS transistor, a twenty-fourth MOS transistor, a twenty-fifth MOS transistor, a twenty-sixth MOS transistor, a twenty-seventh MOS transistor, a twenty-eighth MOS transistor, a twenty-ninth MOS transistor, a thirtieth MOS transistor, a first virtual transistor, a second virtual transistor, a first capacitor, a second capacitor, a third capacitor, a fourth capacitor, a first resistor and a second resistor; the first MOS transistor, the second MOS transistor, the seventh MOS transistor, the eighth MOS transistor, the ninth MOS transistor, the tenth MOS transistor, the eleventh MOS transistor, the twelfth MOS transistor, the fifth MOS transistor, the sixteenth MOS transistor, the seventeenth MOS transistor, the twelfth MOS transistor, the twenty-first MOS transistor, the twenty-second MOS transistor, the twenty-third MOS transistor, the twenty-fourth MOS transistor, the twenty-fifth MOS transistor and the thirtieth MOS transistor are all NMOS transistors, the third MOS transistor, the fourth MOS transistor, the fifth MOS transistor, the sixth MOS transistor, the thirteenth MOS transistor, the fourteenth MOS transistor, the eighteenth MOS transistor, the nineteenth MOS transistor, the twenty-sixth MOS transistor, the twenty-seventh MOS transistor, the twenty-eighth MOS transistor and the twenty-ninth MOS transistor are all PMOS transistors, and the first virtual transistor and the second virtual transistor are both N-type virtual transistors;

wherein a gate of the first MOS transistor and a gate of the first virtual transistors are connected and a connecting terminal is the positive input terminal of the first operational amplifier, a source of the first MOS transistor and a drain of the first virtual transistor are connected, a drain of the first MOS transistor, a drain of the second MOS transistor and a source of the thirtieth MOS transistor are connected, a source of the first virtual transistor, a drain of the third MOS transistor and a source of the fifth MOS transistor are connected, a gate of the second MOS transistor and a gate of the second virtual transistor are connected and a connecting terminal is the negative input terminal of the first operational amplifier, a source of the second MOS transistor and a drain of the second virtual transistor are connected, a source of the second virtual transistor and one terminal of the second capacitor are connected, a gate of the third MOS transistor, a gate of the fourth MOS transistor, a gate and source of the twenty-fourth MOS transistor and a gate and source of the twenty-sixth MOS transistor are connected, a source of the third MOS transistor, a source of the seventh MOS transistor and a gate of the eleventh MOS transistor are connected, a drain of the fourth MOS transistor, a source of the sixth MOS transistor and one terminal of the first capacitor are connected, a source of the fourth MOS transistor, a source of the eighth MOS transistor and a gate of the twelfth MOS transistor are connected, a gate of the fifth MOS transistor, a gate of the sixth MOS transistor, a source of the sixteenth MOS transistor and a gate and source of the eighteenth MOS transistor are connected and a connecting terminal has a common-mode level Vcm accessed thereto, a drain of the fifth MOS transistor, a drain of the sixth MOS transistor, a drain of the thirteenth MOS transistor, a drain of the fourteenth MOS transistor, a drain of the eighteenth MOS transistor, a drain of the nineteenth MOS transistor, a drain of the twenty-seventh MOS transistor, a drain of the twenty-eighth MOS transistor and a drain of the twenty-ninth MOS transistor are connected and a connecting terminal is grounded Vss, a gate of the seventh MOS transistor, a gate of the eighth MOS transistor, a drain of the twenty-sixth MOS transistor, a gate of the twenty-eighth MOS transistor and a gate and source of the twenty-ninth MOS transistor are connected, a drain of the seventh MOS transistor and a source of the ninth MOS transistor are connected, a drain of the eighth MOS transistor and a source of the tenth MOS transistor are connected, a gate of the ninth MOS transistor, a gate of the tenth MOS transistor, a gate of the thirtieth MOS transistor, a gate of the fifteenth MOS transistor, a gate and source of the twentieth MOS transistor, a gate of the twenty-first MOS transistor, a gate of the twenty-second MOS transistor and a drain of the twenty-third MOS transistor are connected, a drain of the ninth MOS transistor, a drain of the tenth MOS transistor, a drain of the eleventh MOS transistor, a drain of the thirtieth MOS transistor, a drain of the twelfth MOS transistor, a drain of the fifteenth MOS transistor, a drain of the twentieth MOS transistor, a drain of the twenty-first MOS transistor and a drain of the twenty-second MOS transistor are connected and a connecting terminal has a supply voltage VDD accessed thereto, a source of the eleventh MOS transistor, the other terminal of the second capacitor, a source of the thirteenth MOS transistor, one terminal of the third capacitor and one terminal of the first resistor are connected and a connecting terminal is the positive output terminal of the first operational amplifier, a source of the twelfth MOS transistor, the other terminal of the first capacitor, a source of the fourteenth MOS transistor, one terminal of the fourth capacitor and one terminal of the second resistor are connected and a connecting terminal is the negative output terminal of the first operational amplifier, a gate of the thirteenth MOS transistor, a gate of the fourteenth MOS transistor, a source of the twenty-second MOS transistor and a drain of the twenty-fifth MOS transistor are connected, a source of the fifteenth MOS transistor, a drain of the sixteenth MOS transistor and a drain of the seventeenth MOS transistor are connected, a gate of the sixteenth MOS transistor, the other terminal of the third capacitor the other terminal of the first resistor, the other terminal of the fourth capacitor and the other terminal of the second resistor are connected, a source of the seventeenth MOS transistor and a gate and source of the nineteenth MOS transistor are connected, a reference voltage Vref is accessed to a gate of the seventeenth MOS transistor, a source of the twenty-first MOS transistor and a drain of the twenty-fourth MOS transistor are connected, a source of the twenty-third MOS transistor and a source of the twenty-eighth MOS transistor are connected, and a gate and source of the twenty-fifth MOS transistor and a gate and source of the twenty-seventh MOS transistor are connected.

6. A harmonic suppression circuit for tunneling magnetoresistance sensors according to claim 3, wherein the second-order sigma-detla modulator comprises a second operational amplifier, a third operational amplifier, a fifth capacitor, a sixth capacitor, a seventh capacitor, an eighth capacitor, a ninth capacitor, a tenth capacitor, an eleventh capacitor, a twelfth capacitor, a quantization comparator and three switched-capacitor circuits, wherein the second operational amplifier and the third operational amplifier adopt a fully differential folding common-source common-gate structure and each have a positive input terminal, a negative input terminal, a positive output terminal and a negative output terminal, the quantization comparator has a positive input terminal, a negative input terminal, a positive output terminal and a negative output terminal, the three switched-capacitor circuits are referred to a first switched-capacitor circuit, a second switched-capacitor circuit and a third switched-capacitor circuit respectively, the first switched-capacitor circuit and the second switched-capacitor circuit each have a positive input terminal, a negative input terminal, a positive output terminal and a negative output terminal, and the third switched-capacitor circuit has a positive input terminal, a negative input terminal, a positive feedback terminal, a negative feedback terminal, a positive output terminal and a negative output terminal; the positive input terminal of the first switched-capacitor circuit and one terminal of the eleventh capacitor are connected and a connecting terminal is the positive input terminal of the second-order sigma-detla modulator, the negative input terminal of the first switched-capacitor circuit and one terminal of the twelfth capacitor are connected and a connecting terminal is the negative input terminal of the second-order sigma-detla modulator, the positive output terminal of the first switched-capacitor circuit, one terminal of the fifth capacitor and the negative input terminal of the second operational amplifier are connected, the negative output terminal of the first switched-capacitor circuit, one terminal of the sixth capacitor and the positive input terminal of the second operational amplifier are connected, the other terminal of the fifth capacitor, the negative output terminal of the second operational amplifier, one terminal of the ninth capacitor and the positive input terminal of the second switched-capacitor circuit are connected, the other terminal of the sixth capacitor, the positive output terminal of the second operational amplifier, one terminal of the tenth capacitor and the negative input terminal of the second switched-capacitor circuit are connected, the positive output terminal of the second switched-capacitor circuit, one terminal of the seventh capacitor and the negative input terminal of the third operational amplifier are connected, the negative output terminal of the second switched-capacitor circuit, one terminal of the eighth capacitor and the positive input terminal of the third operational amplifier are connected, the other terminal of the seventh capacitor, the negative output terminal of the third operational amplifier and the positive input terminal of the third switched-capacitor circuit are connected, the other terminal of the eighth capacitor, the positive output terminal of the third operational amplifier and the negative input terminal of the third switched-capacitor circuit are connected, the other terminal of the ninth capacitor, the other terminal of the eleventh capacitor and the positive feedback terminal of the third switched-capacitor circuit are connected, the other terminal of the tenth capacitor, the other terminal of the twelfth capacitor and the negative feedback terminal of the third switched-capacitor circuit are connected, the positive output terminal of the third switched-capacitor circuit and the negative input terminal of the quantization comparator are connected, the negative output terminal of the third switched-capacitor circuit and the positive input terminal of the quantization comparator are connected, the negative output terminal of the quantization comparator is the negative output terminal of the second-order sigma-detla modulator, and the positive output terminal of the quantization comparator is the positive output terminal of the second-order sigma-detla modulator.

7. A harmonic suppression circuit for tunneling magnetoresistance sensors according to claim 6, wherein the first switched-capacitor circuit comprises a thirteenth capacitor, a fourteenth capacitor and eight CMOS complementary switches, wherein the eight CMOS complementary switches are referred to as a ninth switch, a tenth switch, an eleventh switch, a twelfth switch, a thirteenth switch, a fourteenth switch, a fifteenth switch and a sixteenth switch respectively, a first connecting terminal of the ninth switch is the positive input terminal of the first switched-capacitor circuit, a first connecting terminal of the eleventh switch is the negative input terminal of the first switched-capacitor circuit, a second connecting terminal of the ninth switch, a first connecting terminal of the fourteenth switch and one terminal of the thirteenth capacitor are connected, a second connecting terminal of the eleventh switch, a first connecting terminal of the sixteenth switch and one terminal of the fourteenth capacitor are connected, the other terminal of the thirteenth capacitor, a first connecting terminal of the thirteenth switch and a first connecting terminal of the tenth switch are connected, the other terminal of the fourteenth capacitor, a first connecting terminal of the twelfth switch and a first connecting terminal of the fifteenth switch are connected, a second connecting terminal of the tenth switch is the positive output terminal of the first switched-capacitor circuit, a second connecting terminal of the twelfth switch is the negative output terminal of the first switched-capacitor circuit, and the common-mode level Vcm is accessed to a second connecting terminal of the thirteenth switch, a second connecting terminal of the fourteenth switch, a second connecting terminal of the fifth switch and a second connecting terminal of the sixteenth switch;

wherein the structure of the second switched-capacitor circuit is completely identical with the structure of the first switched-capacitor circuit; and the structure of the third switched-capacitor circuit is basically the same as the structure of the first switched-capacitor circuit and is different from the structure of the first switched-capacitor circuit in that a connecting terminal of the other terminal of the thirteenth capacitor, the first connecting terminal of the thirteenth switch and the first connecting terminal of the tenth switch is the positive feedback terminal of the third switched-capacitor circuit, and a connecting terminal of the other terminal of the fourteenth capacitor, the first connecting terminal of the twelfth switch and the first connecting terminal of the fifteenth switch is the negative feedback terminal of the third switched-capacitor circuit.

8. A harmonic suppression circuit for tunneling magnetoresistance sensors according to claim 6, wherein the circuit structure of the second operational amplifier and the circuit structure of the third operational amplifier are the same as the circuit structure of the first operational amplifier.

\* \* \* \* \*